United States Patent
Yang et al.

(10) Patent No.: US 8,068,321 B2
(45) Date of Patent: Nov. 29, 2011

(54) INPUT SURGE PROTECTION DEVICE USING JFET

(75) Inventors: Eric Yang, Saratoga, CA (US); Ognjen Milic, San Jose, CA (US); Jinghai Zhou, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 209 days.

(21) Appl. No.: 12/263,106

(22) Filed: Oct. 31, 2008

(65) Prior Publication Data

US 2010/0110595 A1 May 6, 2010

(51) Int. Cl.
*H02H 3/20* (2006.01)
*H02H 9/04* (2006.01)
*H02H 9/00* (2006.01)

(52) U.S. Cl. .................. 361/91.6; 361/56; 361/91.1
(58) Field of Classification Search ............... 361/91.6
See application file for complete search history.

(56) References Cited

U.S. PATENT DOCUMENTS

| RE33,807 | E | * | 1/1992 | Abel et al. ............. 340/500 |
| 2008/0007304 | A1 | * | 1/2008 | Yang .................. 327/34 |
| 2008/0308838 | A1 | * | 12/2008 | McNutt et al. ......... 257/133 |
| 2010/0110595 | A1 | * | 5/2010 | Yang et al. ............ 361/56 |

* cited by examiner

*Primary Examiner* — Dharti Patel
(74) *Attorney, Agent, or Firm* — Perkins Coie LLP

(57) ABSTRACT

An input surge suppression device and method that uses a simple JFET structure. The JFET has its gate clamped to a predetermined value, its the drain receives the input voltage from an input power source, its source is connected to the input of a down-stream device, and a resistor connected between the drain and the gate or between the source and the gate. Thus, when the drain voltage approximates the clamped gate voltage, the source voltage nearly equals the drain voltage. When the drain voltage rises above the clamped gate voltage, the source voltage is lower than the drain voltage. The downstream device may be a DC-DC converter and the gate is biased by the enable (EN) pin of a DC-DC converter.

11 Claims, 11 Drawing Sheets

US 8,068,321 B2

INPUT SURGE PROTECTION DEVICE USING JFET

TECHNICAL FIELD

The present invention relates to a protection device, and more particularly, to an input surge suppression FET for power converters.

BACKGROUND

Power adapters or converters can be damaged by over voltage appearing at the input resulting from, for example, lightning, high voltage disturbance, power source instability, load dump, etc. . . . For automotive cigarette lighting adapters (CLA) or other car battery powered electronic devices, a load dump is a severe transient encountered where the battery is disconnected. As seen in FIG. 1, a load dump is generated with a time duration from several milliseconds to several hundred milliseconds and a voltage spike of 25V to 90V in a 12V system. This may damage the adapters or converters. Thus, the input voltage applied to those devices should be limited to protect them from over voltage damage.

There are generally two ways to achieve the input surge protection. Turning to FIG. 2, a first method has an input surge protection circuit 10 that uses a high voltage MOSFET Q working as a source follower. Its gate is clamped by a zener diode D to a set clamp voltage so that the source voltage will follow the gate. This approach requires external components that are difficult to be integrated into a single package. Turning to FIG. 3, a second approach adds an expensive Transient Voltage Suppressive (TVS) device at the input rail to absorb any over voltage transient. Both approaches have high cost.

SUMMARY

The present disclosure is an input surge suppression device and method that uses a simple JFET structure. The JFET as an input surge protection device adopts its specific characteristics, with a configuration as follows: the gate is clamped to a predetermined value, the drain receives the input voltage from the battery (or other input source), the source of the JFET is connected to the input of a down-stream device and a resistor is connected between the drain and the gate or between the source and the gate wherein the down-stream device is an CLA or other converter. Thus, when the drain voltage approximates the clamped gate voltage, the source voltage nearly equals the drain voltage. When the drain voltage rises above the clamped gate voltage, the source voltage is lower than the drain voltage. The higher the drain voltage, the larger the difference between the drain voltage and the source voltage. The source voltage used to supply the down-stream device remains relatively low when the drain suffers from a high input voltage. In one embodiment, the down-stream device is a DC-DC converter and the gate is biased by the enable (EN) pin of a DC-DC converter. This input surge protection device applying a JFET has a much simpler structure and smaller size compared to the prior art, and moreover, the cost is reduced.

In one embodiment, the JFET comprises a N+ layer on a first surface as the drain, P regions inside a N− epitaxial layer implanted from the opposite surface and electrically connected together as the gate and N+ contact regions electrically connected together as the source. This JFET structure is manufactured with a planar process, develops current carrying ability, and is easy to be integrated.

DETAILED DESCRIPTION

At the outset, it should be noted that in order to simplify the description, the embodiments in the present invention only show DC-DC converters as the down-stream device. However, the input surge protection circuit can be used for other types of down-stream devices.

Figure 1:
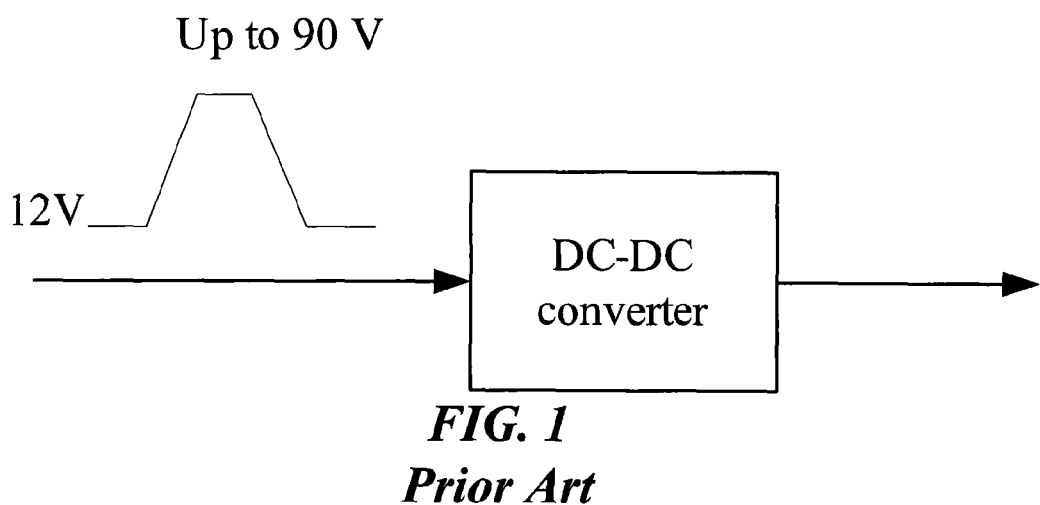
FIG. 1 shows a systematic diagram of the input surge caused by load dump.
Figure 2:
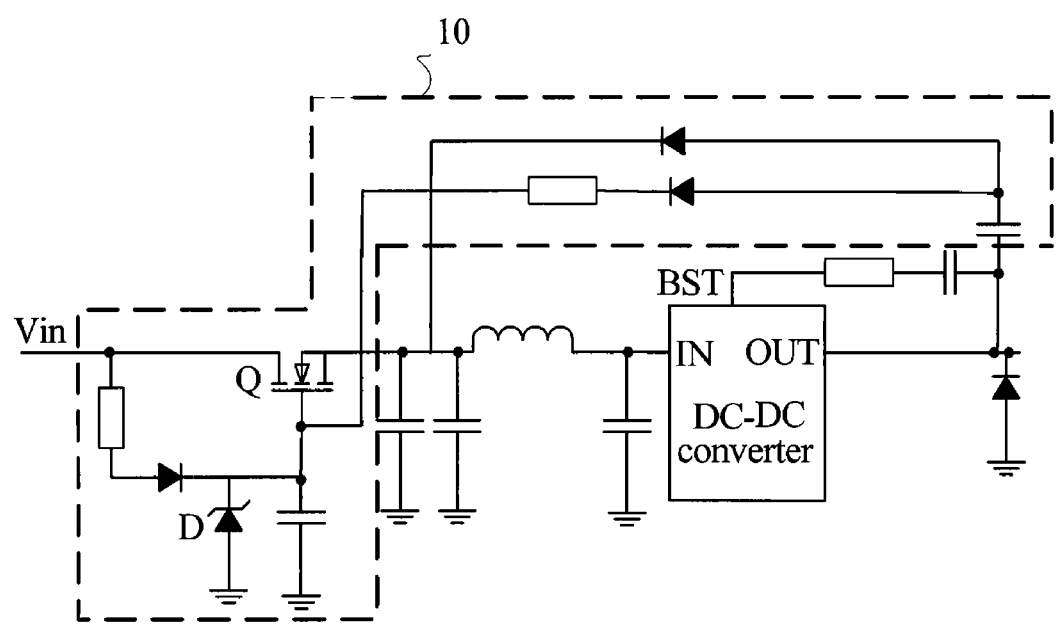
FIG. 2 shows a MOSFET used as a source follower to form an input surge protection circuit.
Figure 3:
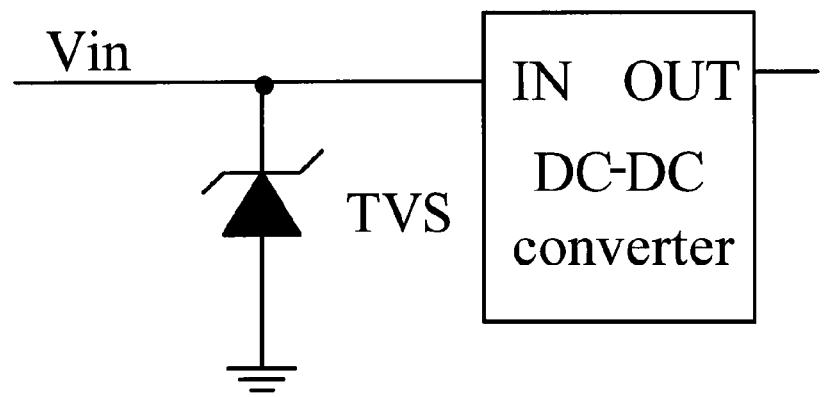
FIG. 3 shows a TVS device.
Figure 4:
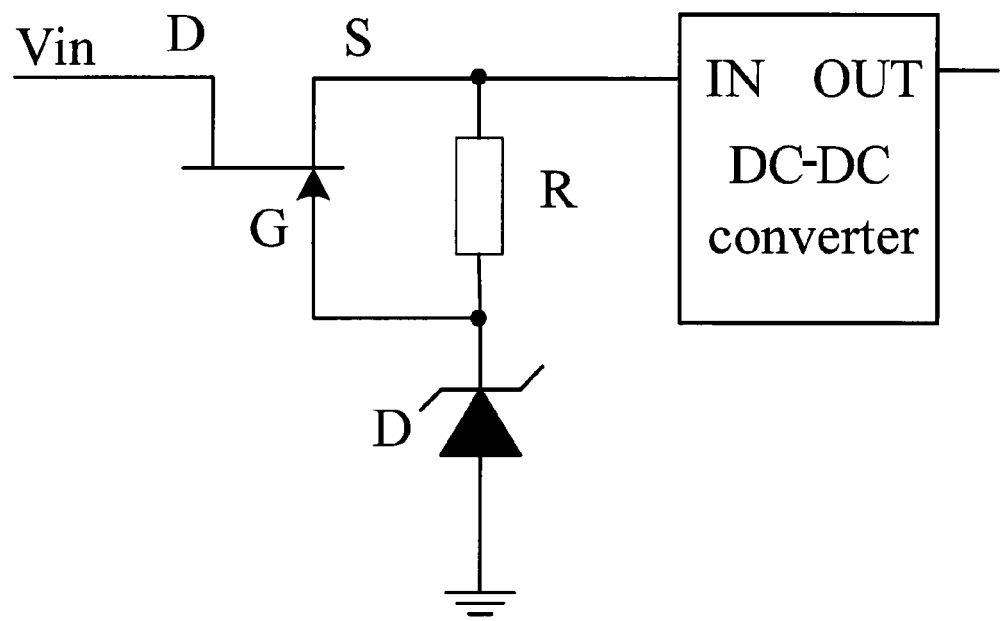
FIG. 4 shows an input surge protection circuit in accordance with the first embodiment of the present invention.

FIG. 4 shows the input surge protection circuit in accordance with the first embodiment of the present invention. As seen, a JFET is configured to protect the input pin IN of the DC-DC converter from high input surge damage. The configuration is as follows: the drain D of the JFET is connected to the power supply terminal Vin, the source S of the JFET is connected to the input terminal IN of the DC-DC converter, and the gate G of the JFET is clamped by a zener diode D to set the clamp voltage. A resistor R is connected between the source and the gate of the JFET to supply the zener diode by generating a current flowing between the source of JFET and the ground.

Figure 5:
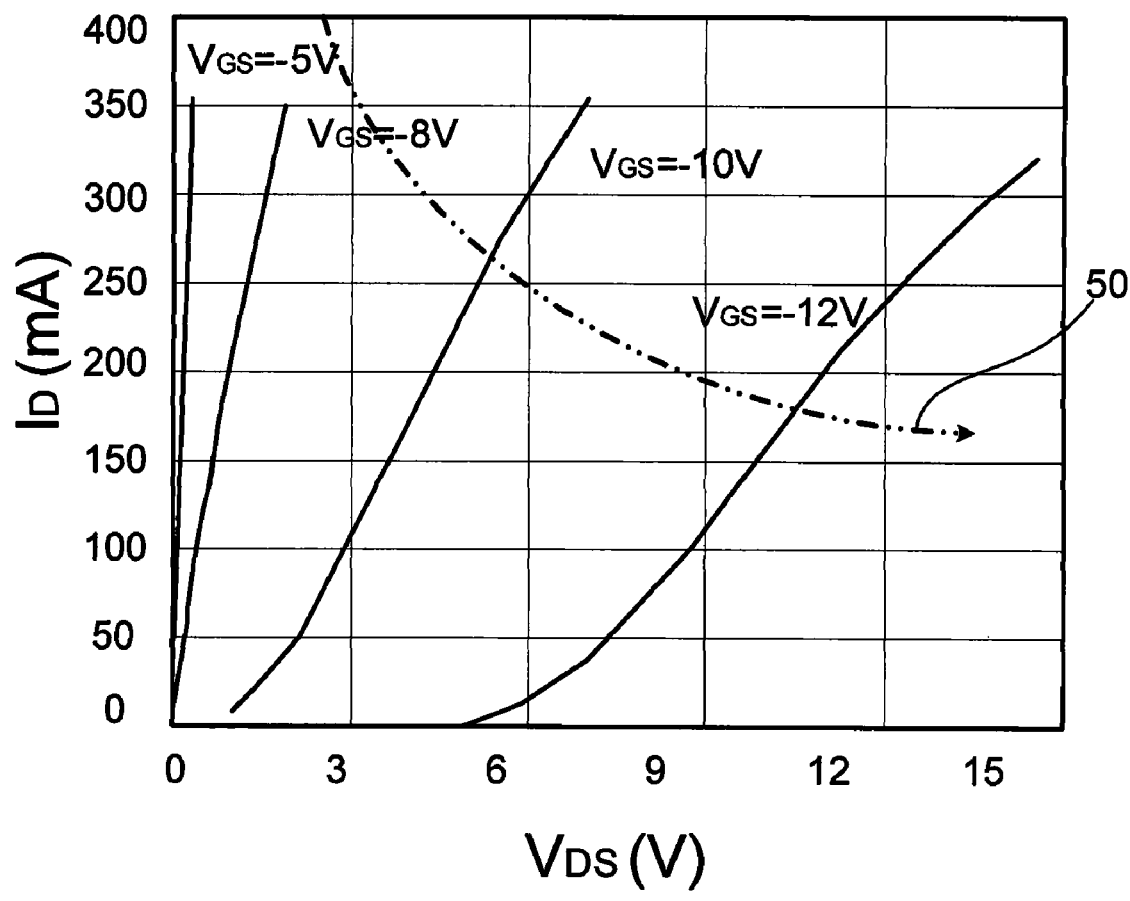
FIG. 5 shows the common drain-source characteristic of a JFET.

FIG. 5 shows the common drain-source characteristic of a JFET. As seen, the current ID slope in the linear region flowing through the JFET is determined by the voltage of VGS. For a particular VGS, RDS remains near constant with various ID levels in the linear region. Tests carried out on the circuit in FIG. 4 show that JFET operates according to the dotted line 50. VDS increases with the increase of VSG. Meanwhile, ID decreases and RDS increase dramatically according to an increase of VSG. As increase of VSG indicates an increase of VS thus an increase of VD, that is to say, the higher the VD, the higher the VDS.

Figure 6:
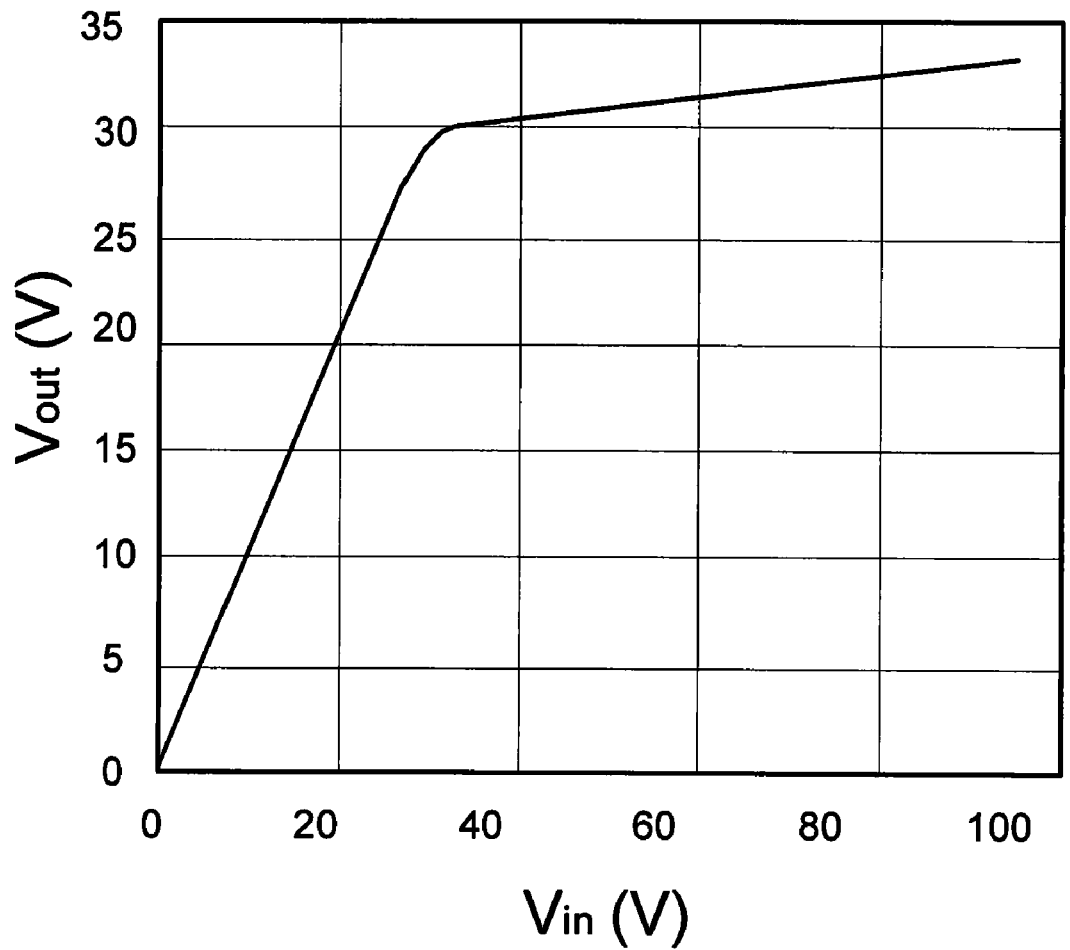
FIG. 6 shows the Vin-Vout characteristic of a JFET.

The Vin-Vout characteristic of JFET is shown in FIG. 6. Vin represents the drain voltage VD of JFET and Vout represents the source voltage VS of JFET. As seen, when Vin is less than a value at an inflexion point, wherein the inflexion point voltage is usually the clamped voltage of VG, VGS equals zero and VD follows the changing of VS. Then the characteristic curve shows a turn at the inflexion point voltage of VD. On the right side of the inflexion point on the chart, Vin is larger than the clamped voltage, thus VD arises above the clamped voltage accordingly which leads to a negative VGS and RDS increases dramatically according to FIG. 5. As seen in the Vin-Vout curve, VS changes slowly compared to VD. The higher the Vin, the higher voltage difference between the drain and the source. That is to say, when VS is relative small, VD approximates VS. When VS becomes higher than the turning point voltage, VS maintains low. This characteristic is used to suppress the input surge and VS is used to supply the down-stream device.

Referring back to FIG. 4, according to the characteristics described in FIG. 5 and FIG. 6, when Vin at the drain is relative low which is below the turning point voltage, taking 30V as an example, VS approximates Vin. RDS is small and the conduction loss is low. When Vin has an input surge and VD is higher than the turning point voltage, VS does not follow VD and changes much slower than VD which prevents the DC-DC converter from input surge damage. The higher the VD, the higher the VDS is.

Figure 7:
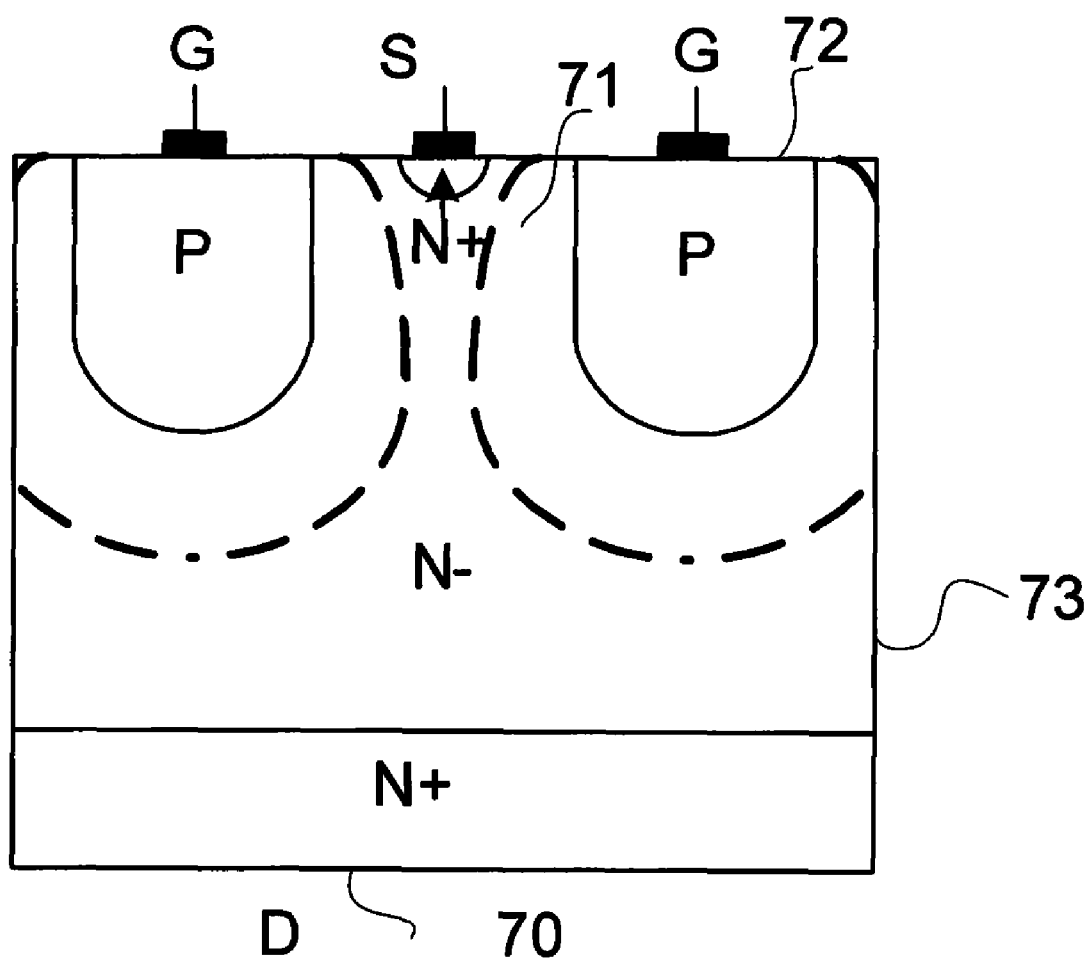
FIG. 7 is a sectional diagram of a JFET structure in accordance with the second embodiment of the present invention.

FIG. 7 shows a cross-sectional view of a JFET structure in accordance with the present disclosure. It comprises an N+ layer on a first surface 70 as the drain D, an N− epitaxial layer and P doped regions for gate G implanted inside the P− epitaxial layer from the opposite surface 72 of the drain. In one embodiment, the N+ layer may be formed on a substrate, such as a semiconductor wafer, a conductor, or an insulator. Between the P+ regions, an N+ region is made as the contact region for source S. There is only one N+ contact region between every two P+ regions. Metal contacts can be further made to the P+ gates regions and the N+ source contact regions wherein the P+ regions are electrically connected together as the gate and the N+ contact regions are electrically connected together as the source. For a JFET device, the number of the P+ regions can be large which enhances the current carrying ability. The side surface 73 of JFET device can also be used as the drain connected to the first surface 70. In one embodiment, the first surface 70 (drain) is attached to an exposed pad by conductive material such as silver epoxy. The resistor between the source and the drain RDS is determined by VGS since a more negative VGS will cause the depletion region 71 around the P+ region broader and the current path narrower which leads to higher RDS.

When the JFET device is configured as in FIG. 4, wherein the gate G is clamped to a predetermined value, the drain is electrically connected to the power supply Vin and the source is connected to the input of the DC-DC converter. If the voltage at D increases, suppose RDS and VS remains the same first, as the current is determined by I=P/VS wherein P is the power of the down-stream DC-DC converter, VDS will remain constant and VS will increase inevitably following VD. Thus, VGS becomes more negative, and the depletion region 71 became broader and RDS increases.

Figure 8:
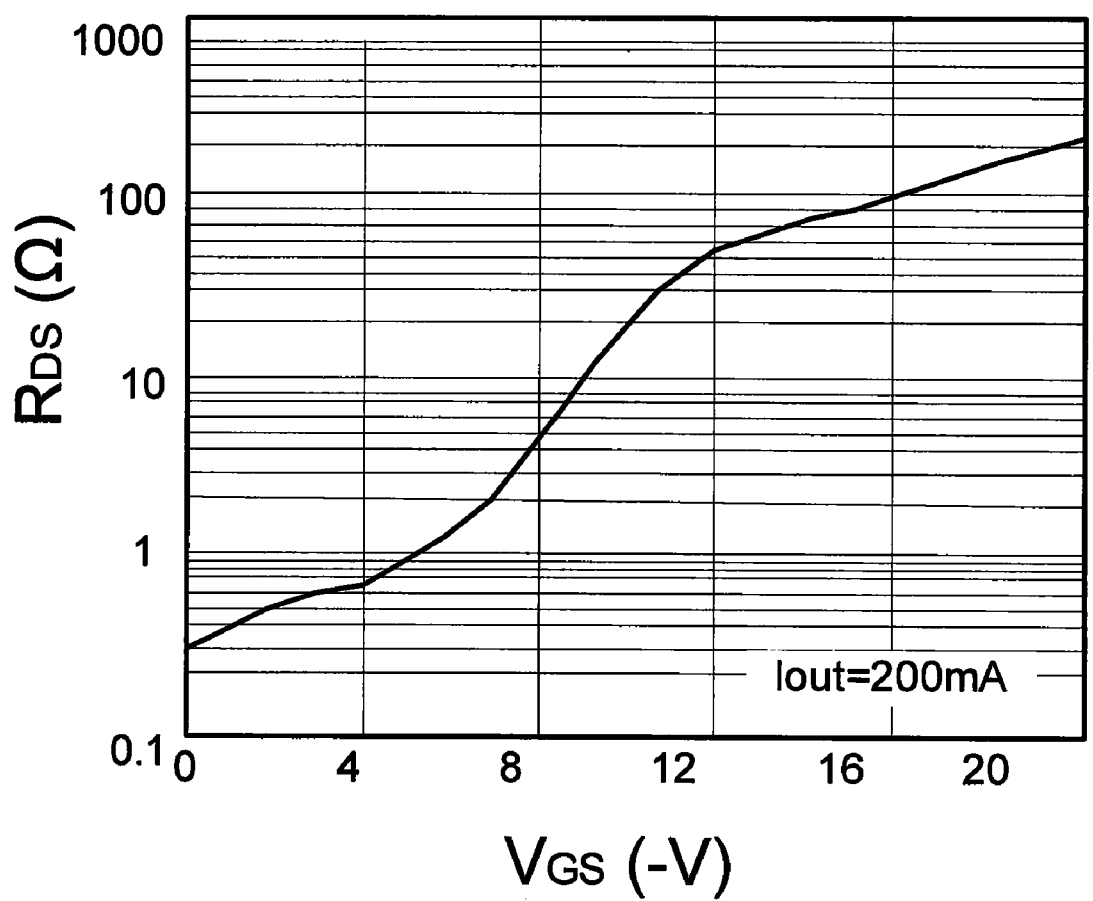
FIG. 8 shows a tested $V_{GS}$-$R_{DS}$ characteristic curve according to the JFET in FIG. 7 used in circuit of the first embodiment.
Figure 9:
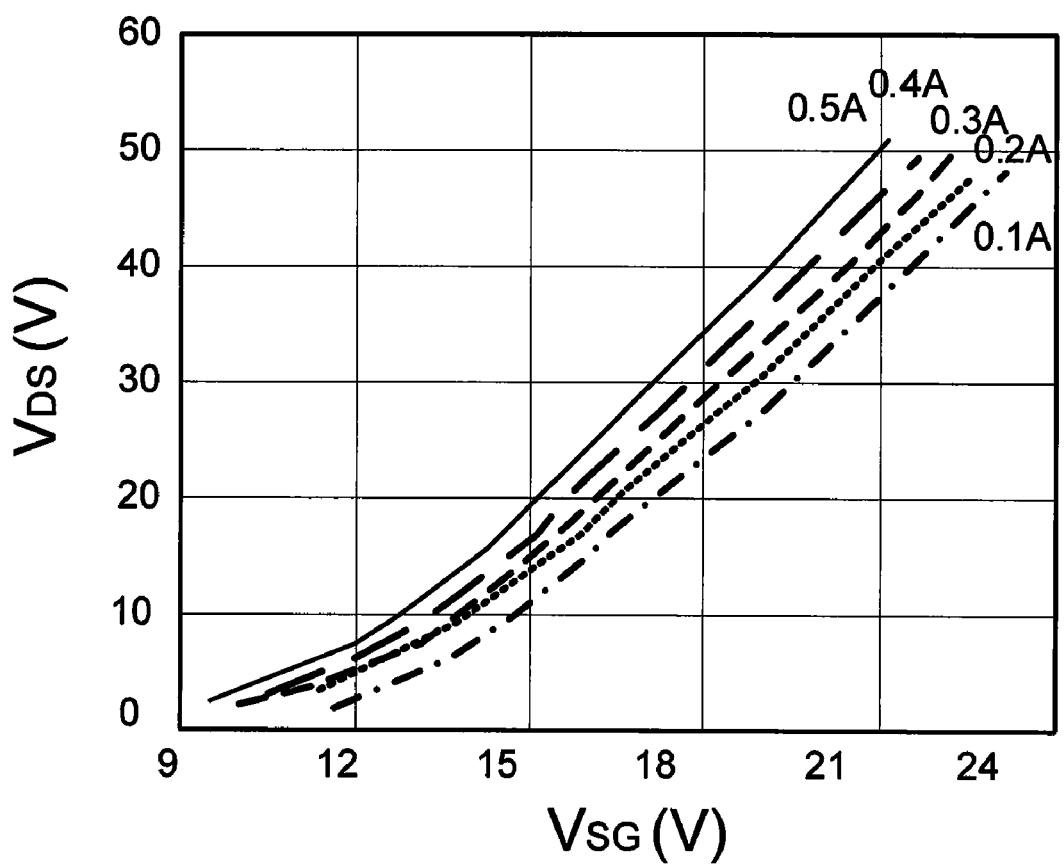
FIG. 9 shows a tested $V_{SG}$-$V_{DS}$ characteristic curve according to the JFET in FIG. 7 used in circuit of the first embodiment.

FIG. 8 and FIG. 9 show the tested characteristics of the above JFET in FIG. 7 with a test circuit configured in FIG. 4. As seen in FIG. 8, RDS increases exponentially with the increase of −VGS. The exponential increase of RDS will lead to the increase of VDS. That is to say, when VD suffers from an input pulse with a high voltage, VS has a much lower value which suppresses the high voltage. Under different current, the VSG-VDS characteristic is tested for the JFET with a structure in FIG. 7. This VSG-VDS characteristic curve is shown in FIG. 9. VDS increases according to the increase of VSG. Thus, when VS increases, the voltage difference between VS and VD becomes larger. That is to say, VS increases much smaller than VD. This characteristic is used to suppress VS from high VD impact.

Figure 10:
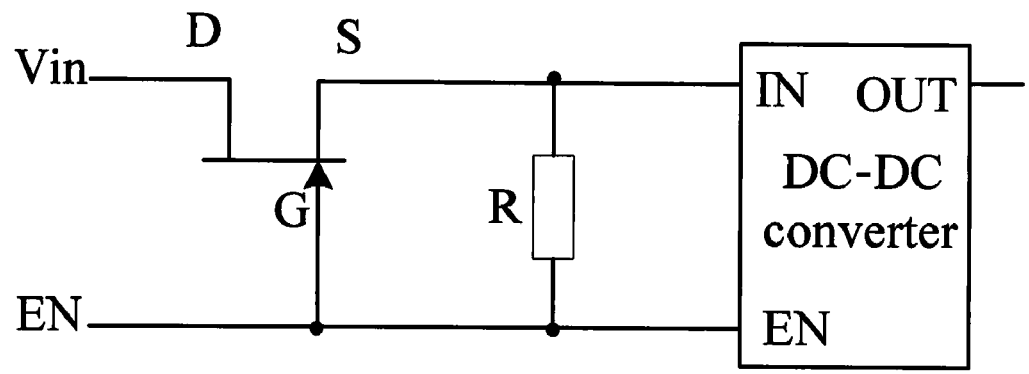
FIG. 10 shows the JFET with the gate connected to the EN pin of a DC-DC converter in accordance with the third embodiment of the present invention.

FIG. 10 shows the JFET of the present invention using the EN (enable) pin of the DC-DC converter to achieve gate clamping. As shown, the gate of the JFET is connected to the enable pin EN of the DC-DC converter. The drain is connected to the power supply terminal Vin and the source is connected to the input terminal IN of the DC-DC converter. EN can be externally controlled by the open drain switch or other approaches. When the DC-DC converter is disabled, EN represents a low voltage, which leads to a high VSG of the JFET, and RDS is very large according to FIG. 5. Thus, the power dissipation of the JFET is minimized during the disabled status. When the converter is enabled, EN pin shows a high voltage which approximates or has a small difference from the normal or optimal Vin value, and JFET functions as an input surge protection device. During the enable status, the gate of JFET is biased that the JFET delivers power with low conduction resistance with normal Vin and represents a high resistance with abnormally high Vin.

Figure 11:
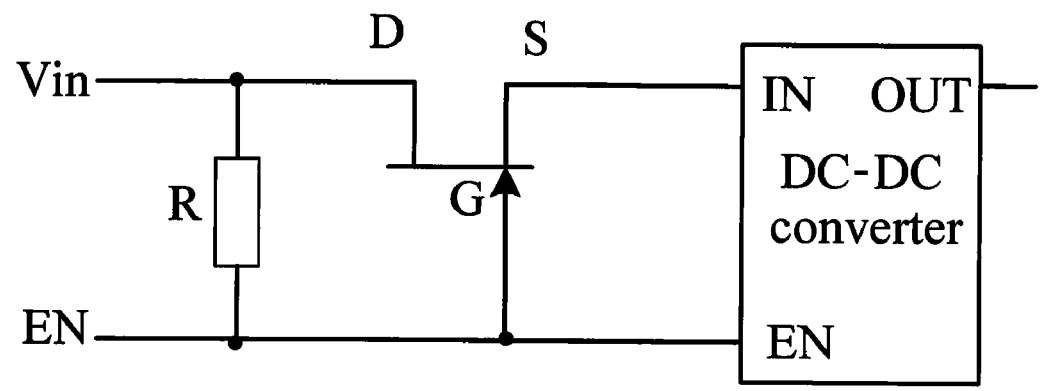
FIG. 11 shows another configuration of JFET used as the input surge protection device for the DC-DC converter as the fourth embodiment of the present invention.

Now referring to FIG. 11, resistance R can also be connected between the Vin terminal and the EN terminal which is used to transfer energy between Vin terminal and EN terminal through R to achieve voltage clamping of EN pin.

Figure 12:
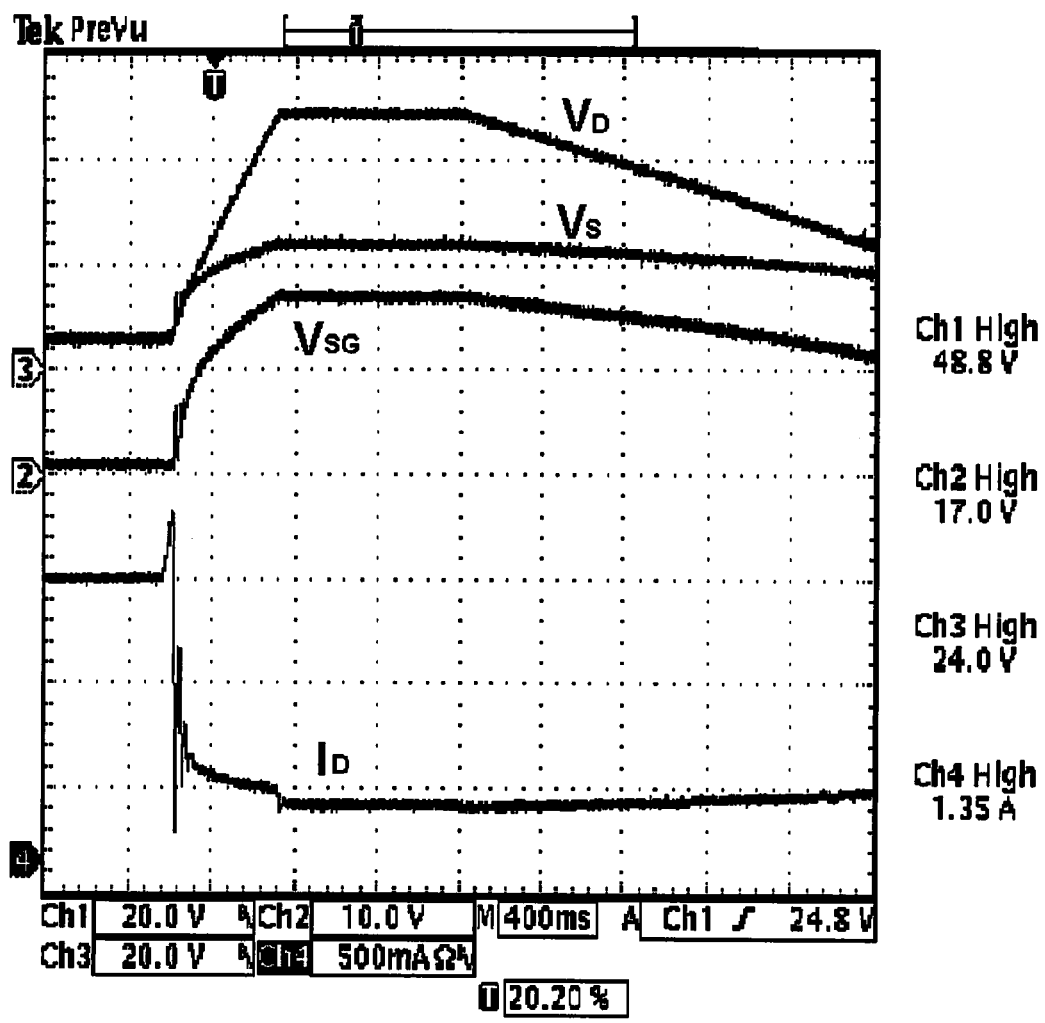
FIG. 12 shows the tested waveforms of the signals in accordance with the second embodiment of the present invention.

FIG. 12 shows the simulative waveforms of the signals in accordance with the embodiment shown in FIG. 4 of the present invention and the embodiment of JFET structure shown in FIG. 7. The gate of the JFET is clamped at 8V. The waveforms sequentially are VD, VS, VSG and ID. As seen, VD arises from 10V to 48.8V. When VD is near 10V, VGS=−2.3V, ID is the highest which has volume of 1.35 A and the difference between VD and Vs is small. At this moment, the JFET can be deemed as a good conductor. When VD becomes higher, VSG increases and the difference between VS and VD arises. Meanwhile, ID drops dramatically. As seen, VS has a highest value of 17V when VD arises to 48.8V. That is to say, when VD suffers a high input surge, the JFET suppresses VS to a much lower voltage. Thus, the IN pin of the converter is protected from input surge damage.

Figure 13:
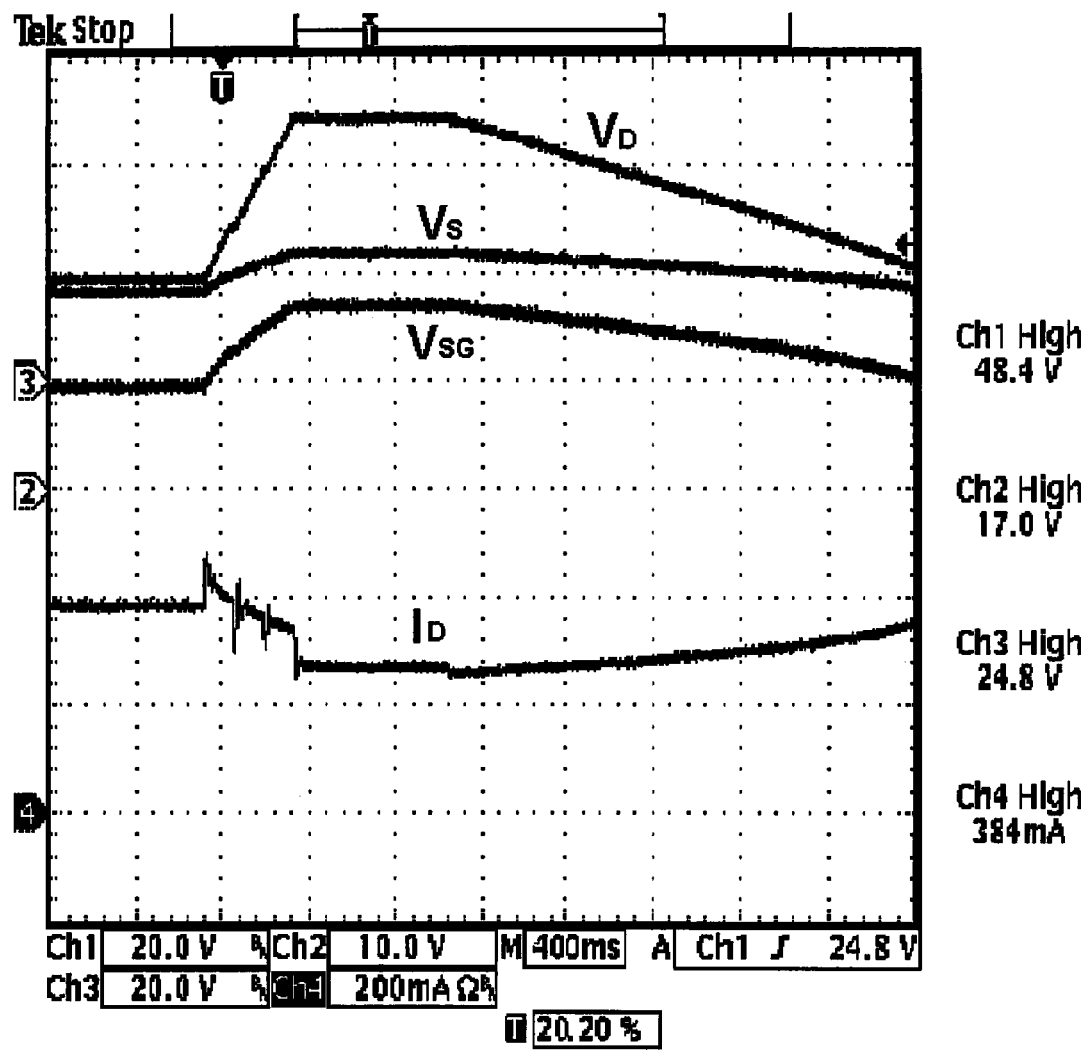
FIG. 13 is another diagram of tested waveforms in accordance with the second embodiment of the present invention.

FIG. 13 is another diagram of simulative waveforms in accordance with the embodiment shown in FIG. 4 wherein VD changes from 20V to 48.8V and with gate clamped at 8V. When VD is near 20V, the difference between VD and VS is relative small and is around 3V. At that time, the current is about 384 mA. When VD continually arises, VS arises much slower and the difference between VD and VS becomes larger. Meanwhile, the current ID drops to a low level.

The embodiments described above show that with gate clamped at a proper value, which may approximate the optimal input voltage of a converter, the JFET can suppress the source voltage at a low level when the drain voltage is abnormally high. This function is used to achieve the input surge protection for converters or other down-stream device.

Obviously many modifications and variations of the present invention are possible in light of the above teachings. It is therefore to be understood that within the scope of the appended claims, the invention may be practiced otherwise than as specifically described. It should be understood, of course, that the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. An input surge suppression device comprising a protection junction field effect transistor (JFET) with its drain receiving an input voltage, its source connected to the input of a downstream device, and its gate clamped at a predetermined value by a zener diode between the gate and ground.

2. The input surge suppression device of claim 1, wherein said down-stream device is a DC-DC converter.

3. The input surge suppression device of claim 2, wherein said predetermined value is set by an enable pin of said DC-DC converter.

4. The input surge suppression device of claim 1, further comprising a resistor, connected between the source and the gate.

5. The input surge suppression device of claim 1, further comprising a resistor, connected between the drain and the gate.

6. The input surge suppression device of claim 1, wherein said predetermined value is set by an enable pin of said DC-DC converter.

7. A junction field effect transistor (JFET) comprising:
an N+ layer on a first surface and acting as a drain;
an N− epitaxial layer on an opposite surface of said first surface and contacting with said N+ layer;
at least two P doped regions forming a gate separated from each other implanted from said opposite surface inside said N− epitaxial layer; and
at least one N+ contact region forming a source from said opposite surface and inside said epitaxial layer and between and separated from said at least two P doped regions,
wherein the drain is connected to an input voltage, the gate is clamped to a predetermined value by a zener diode between the gate and ground and the source is connected to a down-stream device.

8. The JFET of claim 7, wherein said down-stream device is a DC-DC converter.

9. The JFET of claim 8, wherein said predetermined value is set by connecting the gate to the enable pin of said DC-DC converter.

10. The JFET of claim 7, wherein said first surface is attached to an exposed pad by conductive material.

11. The JFET of claim 10, wherein said conductive material is silver epoxy.

* * * * *